United States Patent
Chang et al.

(10) Patent No.: US 6,355,522 B1
(45) Date of Patent: *Mar. 12, 2002

(54) EFFECT OF DOPED AMORPHOUS SI THICKNESS ON BETTER POLY 1 CONTACT RESISTANCE PERFORMANCE FOR NAND TYPE FLASH MEMORY DEVICES

(75) Inventors: Kent Kuohua Chang, Cupertino; John Jianshi Wang; Yuesong He, both of San Jose, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/263,699

(22) Filed: Mar. 5, 1999

Related U.S. Application Data

(63) Continuation-in-part of application No. 09/205,899, filed on Dec. 4, 1998.

(51) Int. Cl.⁷ .............................................. H01L 21/336
(52) U.S. Cl. ........................ 438/257; 438/261; 257/344
(58) Field of Search ................................. 257/321, 344, 257/315; 438/264, 268, 261, 257, 266

(56) References Cited

U.S. PATENT DOCUMENTS

| | | | |
|---|---|---|---|
| 4,698,787 A | 10/1987 | Mukherjee et al. | 365/185 |
| 5,148,394 A | 9/1992 | Iwahashi | 365/185 |

(List continued on next page.)

OTHER PUBLICATIONS

Haddad et al., "Degradations Due to Hole Trapping in Flash Memory Cells", IEEE Electron Device Letters, vol. 10, No. 3 (Mar. 1989), pp. 117–199.

Wolf et al.; "Silicon Process For The VLSI Era Vol. 1: Process Technology", Lattice Press (1986) p. 28.

*Primary Examiner*—Long Pham
*Assistant Examiner*—William David Coleman
(74) *Attorney, Agent, or Firm*—Renner, Otto, Boisselle & Sklar, LLP

(57) ABSTRACT

In one embodiment, the present invention relates to a method of forming a flash memory cell, involving the steps of forming a tunnel oxide on a substrate; forming a first polysilicon layer over the tunnel oxide by chemical vapor deposition using a silicon containing gas and a mixture of a phosphorus containing gas and a carrier gas, the first polysilicon layer having a thickness from about 800 Å to about 1,000 Å; forming an insulating layer over the first polysilicon layer, the insulating layer comprising a first oxide layer over the first polysilicon layer, a nitride layer over the first oxide layer, and a second oxide layer over the nitride layer; forming a second polysilicon layer over the insulating layer; forming a tungsten silicide layer over the second polysilicon layer by chemical vapor deposition using $WF_6$ and $SiH_2Cl_2$; etching at least the first polysilicon layer, the second polysilicon layer, the insulating layer, and the tungsten silicide layer thereby defining at least one stacked gate structure; and forming a source region and a drain region in the substrate, thereby forming at least one memory cell.

28 Claims, 2 Drawing Sheets

U.S. PATENT DOCUMENTS

| | | | |
|---|---|---|---|
| 5,231,299 A | 7/1993 | Ning et al. | 438/257 |
| 5,420,060 A | 5/1995 | Gill et al. | 438/264 |
| 5,500,249 A | 3/1996 | Telford et al. | |
| 5,508,957 A | 4/1996 | Momodomi et al. | 365/185.17 |
| 5,512,505 A | 4/1996 | Yuan et al. | 438/264 |
| 5,518,950 A | 5/1996 | Ibok et al. | 437/67 |
| 5,561,620 A | 10/1996 | Chen et al. | 365/218 |
| 5,589,413 A * | 12/1996 | Sung et al. | 438/261 |
| 5,598,369 A | 1/1997 | Chen et al. | 365/185.27 |
| 5,620,615 A | 4/1997 | Keller | |
| 5,650,649 A | 7/1997 | Tsukiji | 257/316 |
| 5,654,217 A | 8/1997 | Yuan et al. | 438/588 |
| 5,661,055 A | 8/1997 | Hsu et al. | 438/259 |
| 5,679,591 A | 10/1997 | Lin et al. | |
| 5,680,345 A | 10/1997 | Hsu et al. | 365/185.01 |
| 5,714,412 A | 2/1998 | Liang et al. | |
| 5,759,896 A | 6/1998 | Hsu | |
| 5,776,811 A | 7/1998 | Wang et al. | |
| 5,789,296 A | 8/1998 | Sung et al. | |
| 5,814,862 A * | 9/1998 | Sung et al. | 257/344 |
| 5,818,083 A * | 10/1998 | Ito | 29/788 |
| 5,981,366 A * | 11/1999 | Koyama et al. | 438/593 |
| 5,990,514 A * | 11/1999 | Choi et al. | 257/315 |
| 6,001,688 A | 12/1999 | Rizzuto | |
| 6,011,289 A * | 1/2000 | Huang et al. | 257/321 |
| 6,057,193 A * | 5/2000 | Wang et al. | 438/266 |
| 6,060,741 A | 5/2000 | Huang | |
| 6,063,666 A | 5/2000 | Chang et al. | |

* cited by examiner

EFFECT OF DOPED AMORPHOUS SI THICKNESS ON BETTER POLY 1 CONTACT RESISTANCE PERFORMANCE FOR NAND TYPE FLASH MEMORY DEVICES

RELATED APPLICATIONS

This application is a continuation-in-part of co-pending application Ser. No. 09/205,899 filed on Dec. 4, 1998.

TECHNICAL FIELD

The present invention generally relates to flash memory devices such as EEPROMs. More particularly, the present invention relates to flash memory devices having, a relatively thick poly 1 film and improved poly 1 contact performance.

BACKGROUND ART

Nonvolatile memory devices include flash EEPROMs (electrical erasable programmable read only memory devices). FIG. 1 represents the relevant portion of a typical flash memory cell 10. The memory cell 10 typically includes a source region 12, a drain region 14 and a channel region 16 in a substrate 18; and a stacked gate structure 20 overlying the channel region 16. The stacked gate 20 includes a thin gate dielectric layer 22 (commonly referred to as the tunnel oxide) formed on the surface of the substrate 18. The stacked gate 20 also includes a polysilicon floating gate 24 which overlies the tunnel oxide 22 and an interpoly dielectric layer 26 which overlies the floating gate 24. Typically, the thickness of the floating gate 24 is about 700 Å. The interpoly dielectric layer 26 is often a multilayer insulator such as an oxide-nitride-oxide (ONO) layer having two oxide layers 26a and 26b sandwiching a nitride layer 26c. A polysilicon control gate 28 overlies the interpoly dielectric layer 26 and a conductive layer 30, such as a tungsten silicide layer, overlies the polysilicon control gate 28. The conductive layer 30 may constitute, in part, a word line. The channel region 16 of the memory cell 10 conducts current between the source region 12 and the drain region 14 in accordance with an electric field developed in the channel region 16 by the stacked gate structure 20.

Generally speaking, a flash memory cell is programmed by inducing hot electron injection from a portion of the substrate, such as the channel section near the drain region, to the floating gate. Electron injection carries negative charge into the floating gate. The injection mechanism can be induced by grounding the source region and a bulk portion of the substrate and applying a relatively high positive voltage to the control electrode to create an electron attracting field and applying a positive voltage of moderate magnitude to the drain region in order to generate "hot" (high energy) electrons. After sufficient negative charge accumulates on the floating gate, the negative potential of the floating gate raises the threshold voltage ($V_{th}$) of its field effect transistor (FET) and inhibits current flow through the channel region through a subsequent "read" mode. The magnitude of the read current is used to determine whether or not a flash memory cell is programmed. The act of discharging the floating gate of a flash memory cell is called the erase function. The erase function is typically carried out by a Fowler-Nordheim tunneling mechanism between the floating gate and the source region of the transistor (source erase or negative gate erase) or between the floating gate and the substrate (channel erase). A source erase operation is induced by applying a high positive voltage to the source region and a 0 V to the control gate and the substrate while floating the drain of the respective memory cell.

Referring still to FIG. 1, conventional source erase operations for the flash memory cell 10 operate in the following manner. The memory cell 10 is programmed by applying a relatively high voltage $V_G$ (e.g., approximately 12 volts) to the control gate 28 and a moderately high voltage $V_D$ (e.g, approximately 9 volts) to the drain region 14 in order to produce "hot" electrons in the channel region 16 near the drain region 14. The hot electrons accelerate across the tunnel oxide 22 and into the floating gate 24 and become trapped in the floating gate 24 since the floating gate 24 is surrounded by insulators (the interpoly dielectric 26 and the tunnel oxide 22). As a result of the trapped electrons, the threshold voltage of the memory cell 10 increases by about 3 to 5 volts. This change in the threshold voltage (and thereby the channel conductance) of the memory cell 10 created by the trapped electrons causes the cell to be programmed.

To read the flash memory cell 10, a predetermined voltage $V_G$ that is greater than the threshold voltage of an unprogrammed cell, but less than the threshold voltage of a programmed cell, is applied to the control gate 28. If the memory cell 10 conducts, then the memory cell 10 has not been programmed (the cell 10 is therefore at a first logic state, e.g., a zero "0"). Likewise, if the memory cell 10 does not conduct, then the memory cell 10 has been programmed (the cell 10 is therefore at a second logic state, e.g., a one "1"). Consequently, it is possible to read each cell 10 to determine whether or not it has been programmed (and therefore identify its logic state).

In order to erase the flash memory cell 10, a relatively high voltage $V_S$ (e.g., approximately 12 volts) is applied to the source region 12 and the control gate 28 is held at a ground potential ($V_G$=0), while the drain region 14 is allowed to float. Under these conditions, a strong electric field is developed across the tunnel oxide 22 between the floating gate 24 and the source region 12. The electrons that are trapped in the floating gate 24 flow toward and cluster at the portion of the floating gate 24 overlying the source region 22 and are extracted from the floating gate 24 and into the source region 12 by way of Fowler-Nordheim tunneling through the tunnel oxide 22. Consequently, as the electrons are removed from the floating gate 24, the memory cell 10 is erased.

The ONO interpoly dielectric layer has a number of important functions including insulating the control gate from the floating gate. Accordingly, it is desirable to form a high quality, relatively thin ONO interpoly dielectric layer. When forming an ONO interpoly dielectric layer, there are a number of concerns. For example, if the top oxide layer is too thick, the required programming voltage increases undesirably. Precisely controlling the thickness of the top oxide layer is a notable concern.

When forming a conductive layer made of tungsten silicide over the polysilicon control gate, tungsten hexafluoride and typically employed. The fluorine content of a tungsten silicide layer made in a conventional manner is typically above about $2 \times 10^{20}$ atoms/cm$^3$. However, when forming tungsten silicide from tungsten hexafluoride, fluorine undesirably diffuses into the top oxide of the ONO interpoly dielectric layer. The undesirable fluorine diffusion causes the top oxide to swell, often by at least about 10%, and even by at least about 20% in thickness. As stated above, an increase in the top oxide thickness requires an undesirable increase in the required programming voltage thus lowering the coupling ratio.

In this connection, there are a number of concerns when forming the conductive layer over the polysilicon control gate. For example, the conductive layer should adequately adhere to the polysilicon control gate. The inability of the conductive layer to adequately adhere to the polysilicon control gate is typically due to delamination of the conductive layer. The conductive layer should also effectively conduct an electrical current. However, current methods of forming a tungsten silicide conductive layer over the polysilicon control gate of a flash memory device result in deleterious microcracking within the tungsten silicide. This is sometimes due to poor step coverage when forming a tungsten silicide conductive layer. Microcracking leads often to undesirably increased word line resistance and poor polysilicon control gate performance.

In view of the aforementioned concerns and problems, there is a need for flash memory cells of improved quality and more efficient methods of making such memory cells.

SUMMARY OF THE INVENTION

As a result of the present invention, a flash memory cell having improved reliability is obtainable by providing an improved poly 1 contact and an improved poly 1 layer. By forming a poly 1 layer in accordance with the present invention, punch through of the poly 1 layer and field oxide layer by the poly 1 contact is minimized and/or eliminated. Moreover, by forming a tungsten silicide conductive layer in accordance with the present invention, the occurrence of microcracking in the tungsten silicide conductive layer is minimized and/or eliminated thus improving the electrical properties of the tungsten silicide conductive layer.

In one embodiment, the present invention relates to a method of forming a flash memory cell, involving the steps of forming a tunnel oxide on a substrate; forming a first polysilicon layer over the tunnel oxide by chemical vapor deposition using a silicon containing gas and a mixture of a phosphorus containing gas and a carrier gas, the first polysilicon layer having a thickness from about 800 Å to about 1,000 Å; forming an insulating layer over the first polysilicon layer, the insulating layer comprising a first oxide layer over the first polysilicon layer, a nitride layer over the first oxide layer, and a second oxide layer over the nitride layer; forming a second polysilicon layer over the insulating layer; forming a tungsten silicide layer over the second polysilicon layer by chemical vapor deposition using $WF_6$ and $SiH_2Cl_2$; etching at least the first polysilicon layer, the second polysilicon layer, the insulating layer, and the tungsten silicide layer thereby defining at least one stacked gate structure; and forming a source region and a drain region in the substrate, thereby forming at least one memory cell.

In another embodiment, the present invention relates to a method of forming a first polysilicon layer for a NAND type flash memory cell, involving depositing the first polysilicon layer using a silicon containing gas and a mixture of a phosphorus containing and a carrier gas by chemical vapor deposition at a temperature from about 450° C. to about 650° C. under a pressure from about 300 mTorr to about 500 mTorr, the first polysilicon layer having a thickness from about 800 Å to about 1,000 Å.

In yet another embodiment, the present invention relates to a method of preventing punch through of a first polysilicon layer by a poly 1 contact in a NAND flash memory device comprising a substrate, a tunnel oxide over the substrate, a floating gate over the tunnel oxide, an ONO multilayer dielectric over the floating gate, a control gate over the ONO insulating layer, and a tungsten silicide layer over the control gate, the tungsten silicide layer made using using $WF_6$ and $SiH_2Cl_2$, involving depositing the first polysilicon layer using silane and a mixture of phosphine and a carrier gas by chemical vapor deposition at a temperature from about 450° C. to about 650° C. under a pressure from about 300 mTorr to about 500 mTorr, the first polysilicon layer having a thickness from about 800 Å to about 1,000 Å.

DISCLOSURE OF INVENTION

Figure 1:
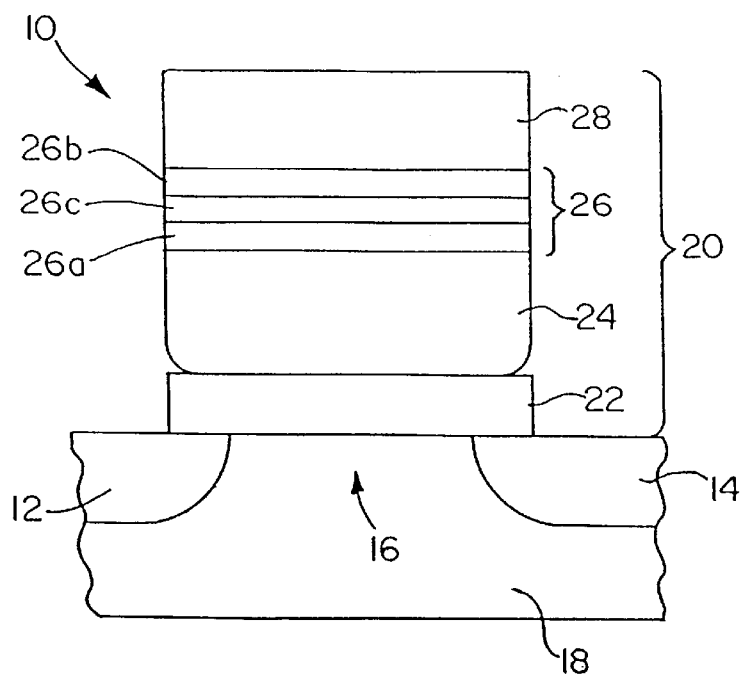
FIG. 1 is a cross-sectional view of relevant portions of a conventional memory cell in a flash memory cell.

By forming a tungsten silicide layer having a lower stress value and thus less microcracks, the reliability of the interpoly dielectric layer can be increased in flash memory cells. While not wishing to be bound to any theory, it is believed that by forming a tungsten silicide layer according to the present invention, it is consequently possible to prevent the occurrence of microcracks due to good step coverage of the tungsten silicide layer and minimize fluorine diffusion to the multilayer dielectric layer. By minimizing fluorine diffusion to the multilayer dielectric layer, the ONO dielectric thickness is reduced (compared with forming a silane based tungsten silicide layer) thus improving the coupling ratio. By preventing microcracks in the tungsten silicide layer, word line resistance is decreased thus improving the performance of resultant flash memory devices.

According to the present invention, the tungsten silicide layer of a flash memory cell, typically formed over a second polysilicon layer (control gate), is formed using dichlorosilane. The flash memory cells according to the invention contain a silicon substrate, tunnel oxide layer over the silicon substrate, a first polysilicon layer (floating gate) over the tunnel oxide layer, an ONO dielectric layer (an oxide/nitride/oxide multilayer dielectric layer) over the first polysilicon layer, a second polysilicon layer (control gate) and the tungsten silicide layer as described herein. The process conditions involve forming the tungsten suicide layer using a dichlorosilane process in a manner to minimize fluorine diffusion and microcracking optionally followed by an annealing step.

Depositing the tungsten silicide is conducted at a temperature from about 450° C. to about 650° C. and a pressure from about 70 Pa to about 120 Pa. In a preferred embodiment, the temperature is from about 500° C. to about 600° C. and the pressure is from about 80 Pa to about 110 Pa. The gas flow includes $SiH_2Cl_2$ and $WF_6$. In one embodiment, the gas flow does not contain silane. Although not required, the gas flow may optionally include an inert or carrier gas such as a noble gas or nitrogen. Nobles gases include He, Ne, Ar, Kr, and Xe.

The gas flow generally contains a sufficient amount of $SiH_2Cl_2$ and $WF_6$ to form a tungsten silicide layer (a $WSi_2$ layer). During formation of the tungsten silicide layer, it is believed that the following chemical reaction takes place.

In one embodiment, the gas flow contains from about 50 standard cubic centimeters per minute (sccm) to about 250 sccm $SiH_2Cl_2$ and from about 2 sccm to about 10 sccm $WF_6$. In another embodiment, the gas flow contains from about 100 sccm to about 200 sccm $SiH_2Cl_2$ and from about 3 sccm to about 9 sccm $WF_6$. In embodiments where an inert gas is employed, the gas flow further contains from about 100 sccm to about 250 sccm of an inert gas. In other embodiments where an inert gas is employed, the gas flow further contains from about 150 sccm to about 200 sccm of an inert gas, such as Ar.

Depositing the tungsten silicide is conducted for a time sufficient to form a tungsten silicide layer of desired thickness. The thickness of the tungsten silicide layer is sufficient to provide a resultant tungsten silicide layer having a thickness from about 1,000 Å to about 1,800 Å, after optional anneal if performed. In one embodiment, the resultant tungsten silicide layer has a thickness from about 1,100 Å to about 1,700 Å. In another embodiment, the resultant tungsten silicide layer has a thickness from about 1,200 Å to about 1,600 Å.

The tungsten silicide deposition according to the present invention forms a tungsten silicide layer having a low or no occurrence of microcracking. As a result, the tungsten silicide layer made in accordance with the present invention has low resistance compared to tungsten silicide layers made using silane.

The tungsten silicide deposition according to the present invention prevents or minimizes fluorine diffusion (emanating from the tungsten hexafluoride) into the ONO multilayer dielectric, and particularly into the top oxide layer of the ONO multilayer dielectric, compared to tungsten silicide layers made using silane. Although not wishing to be bound by any theory, it is believed that fluorine diffusion causes an undesirable increase in ONO multilayer dielectric thickness. Thus, the tungsten silicide deposition according to the present invention also minimizes the thickness of the ONO multilayer dielectric. In one embodiment, compared to the thickness of an ONO multilayer dielectric over which a tungsten silicide deposition technique using silane is performed, the thickness of the ONO multilayer dielectric over which a tungsten silicide deposition according to the present invention is performed is at least about 8 Å less. In another embodiment, compared to the thickness of an ONO multilayer dielectric over which a tungsten silicide deposition technique using silane is performed, the thickness of the ONO multilayer dielectric over which a tungsten silicide deposition according to the present invention is performed is at least about 10 Å less. In other words, the thickness of the ONO multilayer dielectric over which a tungsten silicide deposition according to the present invention is performed does not increase or does not substantially increase (less than about 2 Å in a 40 Å thick multilayer dielectric) due to fluorine diffusion.

The fluorine content of the tungsten silicide layer made in accordance with the present invention is relatively low compared with the fluorine content of conventionally made tungsten silicide layers, such as those made using silane. In one embodiment, the fluorine content of the tungsten silicide layer made in accordance with the present invention is below about $1 \times 10^{18}$ atoms/cm$^3$. In another embodiment, the fluorine content of the tungsten silicide layer made in accordance with the present invention is below about $1 \times 10^{17}$ atoms/cm$^3$. In yet another embodiment, the fluorine content of the tungsten silicide layer made in accordance with the present invention is below about $1 \times 10^{16}$ atoms/cm$^3$.

After the tungsten silicide deposition, an optional anneal step is performed. Although not required, annealing the tungsten silicide layer can, in some instances, further contribute to the ability of the tungsten silicide layer to resist microcracking and minimize fluorine diffusion. In a preferred embodiment, a rapid thermal anneal (RTA) is performed. Annealing of the tungsten silicide layer is preferably conducted in an ambient atmosphere, such as a nitrogen ($N_2$) atmosphere. In one embodiment, annealing is conducted at a temperature from about 850° C. to about 950° C. In a preferred embodiment, annealing is conducted at a temperature from about 875° C. to about 925° C.

In one embodiment, annealing is conducted for a time from about 10 seconds to about 30 seconds. In a preferred embodiment, annealing is conducted for a time from about 15 seconds to about 25 seconds. The annealing primarily serves to further decrease the occurrence of microcracking in the tungsten silicide layer.

Flash memory cells made in accordance with the present invention (containing a dichlorosilane based tungsten silicide film) are characterized by a high charge to breakdown (Qbd) compared to flash memory cells made with a silane based tungsten silicide film. To measure Qbd of a dielectric layer, a current is forced through a specified path until the dielectric layer is rendered conductive. A high Qbd is desirable. For example, Qbd for an oxide layer having a thickness of about 85 Å under a dichlorosilane based tungsten silicide film having a thickness of about 1,200 Å (made in accordance with the present invention) and over a doped amorphous silicon layer having a thickness of about 1,200 Å (mimicking a control gate) is about 7.5 C/cm$^2$ compared to a Qbd of 3.5 C/cm$^2$ for an oxide layer having a thickness of about 85 Å under a silane (monosilane, $SiH_4$) based tungsten silicide film having a thickness of about 1,500 Å (not made in accordance with the present invention) and over a doped amorphous silicon layer having a thickness of about 1,200 Å (mimicking a control gate). In another example, Qbd for an oxide layer having a thickness of about 150 Å under a dichlorosilane based tungsten silicide film having a thickness of about 1,200 Å (made in accordance with the present invention) and over a doped amorphous silicon layer having a thickness of about 1,200 Å is about 20 C/cm$^2$ compared to a Qbd of 10 C/cm$^2$ for an oxide layer having a thickness of about 150 Å under a silane based tungsten silicide film having a thickness of about 1,500 Å (not made in accordance with the present invention) and over a doped amorphous silicon layer having a thickness of about 1,200 Å .

Moreover, flash memory cells made in accordance with the present invention (containing a dichlorosilane based tungsten silicide film) have high current densities, especially when compared with flash memory cells made with a silane based tungsten silicide film. Since less charge trapping is associated with high current densities, flash memory cells made in accordance with the present invention have less charge trapping compared with flash memory cells made with a silane based tungsten silicide film.

By forming a first polysilicon layer (poly 1 layer) with a relatively large thickness by an in situ deposition method, punch through of the first polysilicon layer and the underlying field oxide layer in flash memory cells is minimized or eliminated. Since the tungsten silicide layer exhibits a very low occurrence of microcracks due to good step coverage, it is necessary to aggressively etch the tungsten silicide layer, the second polysilicon layer, the ONO multilayer dielectric, and a portion of the first polysilicon layer into to provide a poly 1 contact. While not wishing to be bound to any theory, it is believed that by forming a first polysilicon layer according to the present invention, it is consequently possible to prevent the occurrence of punch through by the poly 1 contact due to the adequate thickness of the first polysilicon layer.

According to the present invention, the first polysilicon layer of a flash memory cell is formed by an in situ doping process in order to have an adequate thickness. Although referred to herein as a first polysilicon layer or a poly 1 layer, the first polysilicon layer is technically a doped amorphous silicon layer, due to the processing described below. Thus, when used herein, the terms first polysilicon layer and poly 1 layer describe a doped amorphous silicon layer.

The process conditions for forming the first polysilicon layer or floating gate material involve depositing polysilicon via low pressure chemical vapor deposition (LPCVD) at a temperature between about 450° C. and about 650° C. and a pressure between about 300 mTorr and about 500 mTorr. In a preferred embodiment, the polysilicon is deposited by LPCVD at a temperature between 500° C. and about 600° C. and at a pressure between about 350 mTorr and about 450 mTorr. The polysilicon of the floating gate material is not doped by subsequent ion implantation; instead, the polysilicon is doped in situ. In other words, the polysilicon of the floating gate material is doped during its formation.

In situ doping and polysilicon deposition are performed via LPCVD under a gas flow of a silicon containing gas such as silane ($SiH_4$) between about 1,500 sccm and about 2,500 sccm and mixture of a phosphorous containing gas in an inert gas between about 10 sccm and about 30 sccm. In a preferred embodiment, in situ doping is conducted under a gas flow of silane between about 1,750 sccm and about 2,250 sccm with a mixture of a phosphorous containing gas in an inert gas between about 15 sccm and about 25 sccm. Inert gases include nonreactive gases including nitrogen, helium, neon, argon, krypton and xenon. In a preferred embodiment, the phosphorous containing gas is phosphine ($PH_3$) and the inert gas is helium. In one embodiment, the amount by weight of phosphorous containing gas in the inert gas is from about 0.9% to about 1.1%. In another embodiment, the amount by weight of phosphorous containing gas in the inert gas is from about 0.95% to about 1.05%.

The dopant level of phosphorus within the resultant floating gate material is relatively low. In one embodiment, the dopant level of phosphorus within the resultant floating gate material is from about $1\times10^{19}$ atoms/$cm^3$ to about $5\times10^{19}$ atoms/$cm^3$. In a preferred embodiment, the dopant level of phosphorus within the resultant floating gate material is from about $2\times10^{19}$ atoms/$cm^3$ to about $4\times10^{19}$ atoms/$cm^3$.

In one embodiment, the thickness of the resultant first polysilicon layer is from about 800 Å to about 1,000 Å. In another embodiment, the thickness of the resultant first polysilicon layer is from about 850 Å to about 950 Å. The thickness of the resultant first polysilicon layer is adequate to prevent punch through by the poly 1 contact.

Referring to FIGS. 2A to 2H, the fabrication of a single flash memory cell is described. A plurality of flash memory cells can be formed on a semiconductor substrate, such as a silicon die, each with an N-type source region and N-type drain region formed within a P portion of the substrate and a P-type channel region interposed between the source and drain regions in accordance with the present invention. Although fabrication of one flash memory cell is described below, it will be understood by those skilled in the art that the methods described herein are applicable to mass production methods wherein two or more cells are formed.

Figure 2A:
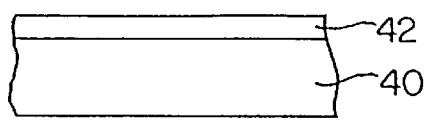
FIGS. 2A to 2F are cross-sectional views illustrating a flash memory cell fabrication method according to one embodiment of the present invention.

Specifically referring to FIG. 2A, a P-type substrate 40 is provided. Thereafter, a thin tunnel oxide layer 42 is formed over the substrate 40 having a thickness of, for example, about 50 Å to about 150 Å using a thermal growth process in a dry oxidation furnace. For instance, the tunnel oxide layer 42 can be formed via dry oxidation at a temperature of about 1050° C., under an atmosphere of oxygen at about 1.33 l, HCl at about 70 cc and argon at about 12.6 l. Alternatively, the tunnel oxide can be formed from oxymitride.

Figure 2B:
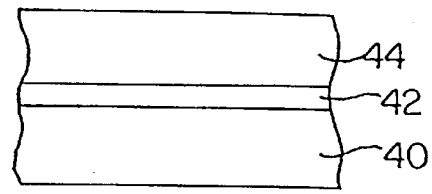

Referring to FIG. 2B, a first polysilicon layer 44 is formed in any suitable manner over the tunnel oxide layer 42. For example, a phosphorus doped polysilicon layer is deposited via LPCVD to form a doped polysilicon layer 44 at 530° C., 400 mTorr, $SiH_4$ at 2000 sccm, and a mixture of 1% by weight $PH_3$ in helium at about 20 sccm. Doping lowers the resistivity of the polysilicon rendering it conductive. The first polysilicon layer 44 has a thickness of about 900 Å.

Figure 2C:
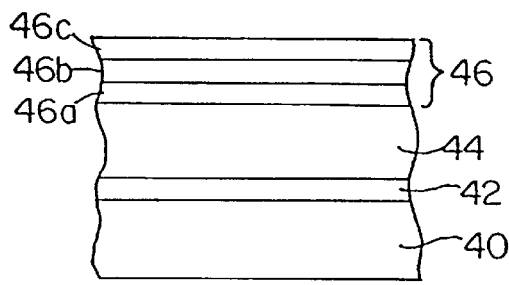

A multi-layer interpoly dielectric 46 is then formed in any suitable maimer over the surface of the substrate 40, as illustrated in FIG. 2C. This layer 46 is often called the interpoly dielectric since (as will be seen shortly) it is sandwiched between the phosphorus doped polysilicon layer (first polysilicon layer constituting the floating gate for a flash memory cell) and a second polysilicon layer which forms the control gate for the cell. The interpoly dielectric 46 is preferably a three layer region of oxide/nitride/oxide (the so called "ONO" layer) and typically has a total thickness of about 120 Å to about 400 Å. Generally speaking, the ONO layer 46 is formed by repetitive depositions of oxide, nitride and oxide to form a dielectric layer in which the nitride is sandwiched between a bottom oxide layer and top oxide layer.

Specifically referring to FIG. 2C, a first or bottom oxide layer 46a is deposited using CVD techniques. For example, a bottom oxide layer 46a is deposited at a temperature of about 750° C. under $SiH_4$ at 20 sccm, $N_2O$ at 1.2 l, and a carrier gas and a pressure of 600 mTorr via LPCVD oxide on the first polysilicon layer. The bottom oxide layer may have a suitable thickness, for example, from about 40 Å to about 60 Å, but typically the thickness is about 50 Å. A nitride layer 46b is next deposited also using CVD techniques. For example, nitride is deposited at a temperature of about 760° C. under $NH_3$ at 600 sccm, $SiH_2Cl_2$ at 100 sccm and a pressure of 330 mTorr to form a nitride layer 46b. The nitride layer 46b may have a suitable thickness, for example, from about 60 Å to about 100 Å, preferably from about 70 Å to about 90 Å, but typically the thickness is about 80 Å.

The second or top oxide layer 46c is formed in a similar manner as the first oxide layer or by wet oxidation at about 950° C. for about 40 minutes using oxygen (about 5 l) and hydrogen (about 9 l) to provide an oxide layer. The top oxide layer may have a thickness from about 20 Å to about 80 Å, but in this embodiment the thickness is about 40 Å.

Figure 2D:
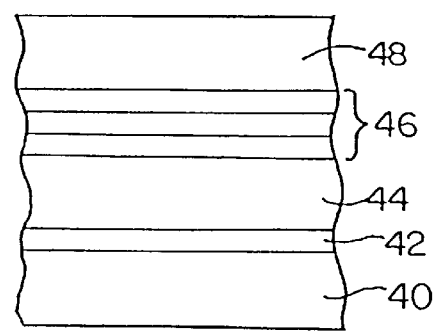

Referring to FIG. 2D, a second polysilicon layer is deposited in any suitable manner. Specifically, a phosphurus doped amorphous polysilicon layer is deposited via CVD to form a doped polysilicon layer 48 at about 530° C., 400 mTorr, $SiH_4$ at 2,000 sccm, and a mixture of 1% by weight $PH_3$ in helium at about 75 sccm. Alternatively, the second polysilicon layer can be deposited by LPCVD followed by ion implantation of a dopant such as phosphorus. Doping lowers the resistivity of the polysilicon rendering it conductive.

Figure 2E:
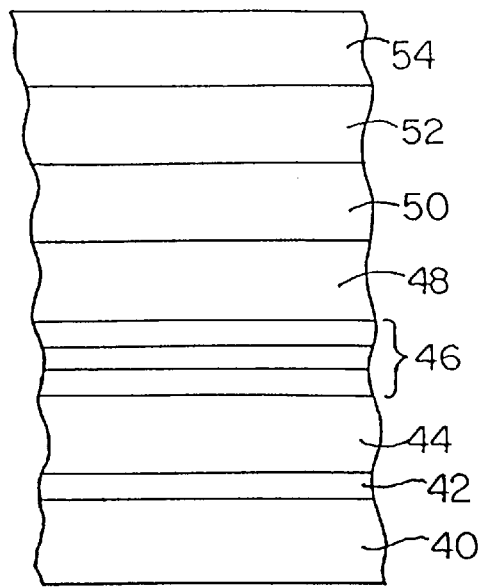

Referring to FIG. 2E, a tungsten silicide layer 50 is deposited via CVD. The tungsten silicide layer 50 provides a lower resistance contact for improved flash memory cell performance. Specifically, the tungsten silicide is deposited at a temperature of about 565° C. and a pressure of about 93 Pa. The gas flow includes $SiH_2Cl_2$ and $WF_6$. The gas flow contains about 150 sccm $SiH_2Cl_2$ and about 5 sccm $WF_6$. The gas flow may further contain about 150 sccm to about 200 sccm of an inert gas, such as Ar. The thickness of the tungsten silicide layer is about 1,400 Å. After the tungsten silicide deposition, an optional RTA is performed in a nitrogen atmosphere. RTA is conducted at about 900° C. for about 20 seconds.

The tungsten silicide deposition according to the present invention forms a tungsten silicide layer having no detectable microcracking. As a result, the tungsten silicide layer made in accordance with the present invention has low resistance compared to tungsten silicide layers made using silane.

The tungsten silicide deposition according to the present invention prevents or minimizes fluorine diffusion into the ONO multilayer dielectric, and particularly into the top oxide layer of the ONO multilayer dielectric, compared to tungsten silicide layers made using silane. Compared to the thickness of an ONO multilayer dielectric over which a tungsten silicide deposition technique using silane is performed wherein the thickness may increase as much as about 8 Å to about 10 Å, the thickness of the ONO multilayer dielectric over which a tungsten silicide deposition according to the present invention is performed does not increase.

Poly-cap layer 52 is deposited over the tungsten silicide layer 50. The poly-cap layer 52 is about 500 Å thick, and is formed via, for example, LPCVD. The poly-cap layer 52 can be used to prevent any potential peeling or cracking of the underlying tungsten silicide 50. A capping layer 54, for example, of SiON is deposited over the poly-cap layer 52. The capping silicon oxynitride layer 54 provides an anti-reflective coating at masking and also acts as a masking layer for subsequent etching.

Figure 2F:
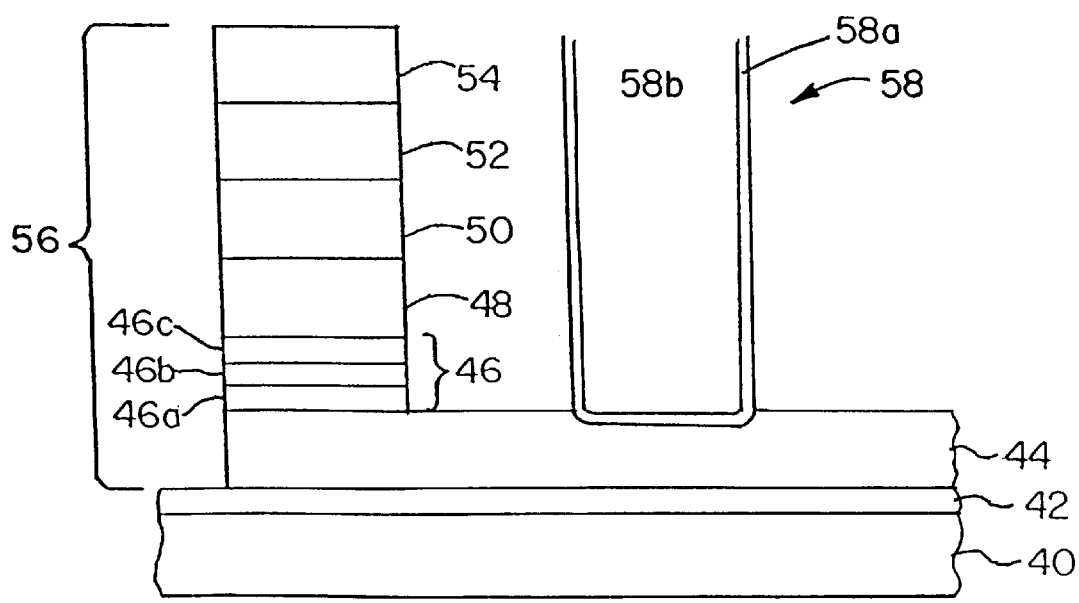

Referring to FIG. 2F, suitable lithography and etching procedures are used to remove various portions of the device and to provide for a contact hole for poly 1 contact 58. After the second polysilicon layer 48, the tungsten silicide layer 50, the poly-cap layer 52 and the capping layer 54 have been formed (a plurality of word lines for the memory cells can be defined in this manner) etching is performed to define one or more pre-stack structures and/or poly 1 contact holes. The etching may be achieved by depositing and defining a photoresist masking layer over the entire surface of the substrate using standard lithography procedures. This is generally termed the gate mask and gate etch. Subsequently, a number of successive etching steps, such as the gate etch and the self aligned etch, are performed to define one or more stack structures 56. This is generally termed the self aligned mask and self aligned etch.

The gate mask and gate etch are performed as follows. First, a resist (not shown) is applied, selectively exposed to radiation and developed whereby various portions removed (either the exposed or unexposed portions). Next, in one embodiment, the etching steps take place in a multi-chamber etch tool wherein a silicon oxynitride capping layer is selectively etched with a fluorinated chemistry such as $CHF_3$—$O_2$ in an oxide chamber. The exposed poly-cap layer and the tungsten silicide layer are then etched with $SF_6$/HBr (or alternatively, $SF_6$/$Cl_2$ or $Cl_2$—$O_2$) and the exposed second polysilicon layer is etched with HBr—$O_2$ in a poly chamber. Etching steps are preferably formed in an integrated process in which the wafers are not exposed to atmosphere when transferring the wafers from one chamber to another.

Once the second polysilicon layer 48, the tungsten silicide layer 50, the poly-cap layer 52 and the capping layer 54 have been removed, a self aligned etch ("SAE") is performed to remove the ONO layer 46 and the phosphorus doped polysilicon layer (first polysilicon layer) 44 in the regions that are not covered by the pre-stack structure (constituted by the unremoved second polysilicon layer, tungsten silicide layer, poly-cap layer and capping layer). The SAE etch is a two step etch process in which the ONO layer 46 is first removed using, for example, a $CF_4$—$O_2$ RIE etch. The second phase of the SAE etch is the removal of the exposed first polysilicon layer 44 to thereby further define the floating gate structures for each respective word line and/or poly 1 contacts The polysilicon etch includes, for example, an HBr—$O_2$ or a HBr-$Cl_2$—$O_2$ RIE etch chemistry. The gate etch and SAE serve to define the stack structure 56 and/or the poly 1 contact hole.

Poly 1 contact 58 is made of a barrier layer 58a and contact plug 58b. In this embodiment, barrier layer 58a is made of two layers by depositing about 600 Å of a barrier metal such as titanium and 150 Å of titanium nitride by CVD. An RTA is optionally conducted. Next, a conductive metal such as tungsten is deposited and then polished to provide poly 1 contact 58. Since the thickness of the first polysilicon layer 44 is about 900 Å, it is of sufficient thickness to prevent punch through by the poly 1 contact 58.

The formation of the source and drain regions by, for example, ion implantation is then conducted using suitable and known means. During the formation of the source and drain regions, the stacked gate structure 56 serves as a self-aligning mechanism. Ion implantation and annealing typically complete the formation of the source and drain regions. In the above manner, an easy method for forming flash memory cells is provided. A flash memory cell with a double-diffused source region or a flash memory cells with a single-diffused source region may be made.

During programming, the source region and the substrate of the memory cell may be tied to a ground via a terminal, respectively, the drain region is coupled to a relatively high voltage (for example, between about +5 V to about +9 V) via a terminal (not shown) and the control gate is connected to a relatively high voltage level (for example, above about +10 V) via a terminal. Electrons are accelerated from the source region to the drain region and so called "hot-electrons" are generated near the drain region. Some of the hot electrons are injected through the relatively thin tunnel oxide layer and become trapped in the floating gate thereby providing the floating gate with a negative potential.

During erasure, a high positive voltage (such as above about +12 V) is applied to the source region via a source terminal. A ground potential ($V_g$ equals 0 V) is applied to the control gate via the control terminal. A similar ground potential ($V_{sub}$ equals 0 V) is applied to the substrate via a substrate terminal. The voltage $V_D$ of the drain region is permitted to float. In this mode, electrons previously stored during programming in the floating gate pass through tunnel oxide layer by way of Fowler-Nordheim tunneling and travel into the source region as a result of the electric field established between the control gate and the source regions ($V_{GS}$ equals about 12 V). Since the top oxide layer is characterized by reduced charge trapping, Fowler-Nordheim tunneling and travel of electrons from the floating gate to the source region are facilitated.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a flash memory cell, comprising:

forming a tunnel oxide on a substrate;

forming a first polysilicon layer over the tunnel oxide by chemical vapor deposition using a silicon containing gas and a mixture of a phosphorus containing gas and a carrier gas, the first polysilicon layer having a thickness from about 800 Å to about 1,000 Å;

forming an insulating layer over the first polysilicon layer, the insulating layer comprising a first oxide layer over the first polysilicon layer, a nitride layer over the first oxide layer, and a second oxide layer over the nitride layer;

forming a second polysilicon layer over the insulating layer;

forming a tungsten silicide layer over the second polysilicon layer by chemical vapor deposition using $WF_6$ and $SiH_2Cl_2$;

etching at least the first polysilicon layer, the second polysilicon layer, the insulating layer, and the tungsten silicide layer thereby defining at least one stacked gate structure; and forming a source region and a drain region in the substrate, thereby forming at least one memory cell.

2. The method of claim 1, wherein the first polysilicon layer is formed by low pressure chemical vapor deposition using from about 1,500 sccm to about 2,500 sccm of the silicon containing gas and from about 10 sccm to about 30 sccm of the mixture of the phosphorus containing gas and the carrier gas.

3. The method of claim 1, wherein the silicon containing gas comprises silane and the carrier gas comprises at least one of nitrogen, helium, neon, argon, krypton and xenon.

4. The method of claim 1, wherein the mixture comprises from about 0.9% to about 1.1% of a phosphorus containing gas.

5. The method of claim 1, wherein the phosphorus containing gas comprises phosphine and the carrier gas comprises helium.

6. The method of claim 1, wherein first polysilicon layer is made using an in situ doping process.

7. The method of claim 1 further comprising annealing the tungsten silicide layer.

8. The method of claim 1, wherein the etching includes forming a contact hole.

9. The method of claim 8, wherein the etching includes removing a portion of the first polysilicon layer.

10. A method of forming a NAND type flash memory cell, comprising:

depositing a first polysilicon layer using a silicon containing gas and a mixture of a phosphorus containing and a carrier gas by chemical vapor deposition at a temperature from about 450° C. to about 650° C. under a pressure from about 300 mTorr to about 500 mTorr, the first polysilicon layer having a thickness from about 800 Å to about 1,000 Å;

forming a tungsten silicide layer above the first polysilicon layer;

etching through the tungsten suicide layer, wherein the etching includes partially etching a portion of the first polysilicon layer; and subsequent to the etching, forming a contact touching the partially-etched portion of the first polysilicon layer.

11. The method of claim 10, wherein the forming the tungsten suicide layer includes forming the tungsten silicide layer by chemical vapor deposition using $WF_6$ and $SiH_2Cl_2$.

12. The method of claim 10, wherein the first polysilicon layer has a thickness from about 850 Å to about 950 Å.

13. The method of claim 10, wherein the mixture comprises from about 0.95% to about 1.05% of a phosphorus containing gas.

14. The method of claim 10, wherein the silicon containing gas comprises silane, the carrier gas comprises at least one of nitrogen, helium, neon, argon, krypton and xenon, and the phosphorus containing gas comprises phosphine.

15. The method of claim 10, wherein the first polysilicon layer has a dopant level of phosphorus from about $1 \times 10^{19}$ atoms/cm$^3$ to about $5 \times 10_{19}$ atoms/cm$^3$.

16. The method of claim 10, wherein the contact includes a barrier layer and a contact plug.

17. The method of claim 10, further comprising, after the depositing the first polysilicon layer and before the forming the tungsten silicide layer, forming an interpoly dielectric layer on the first polysilicon layer, and forming a second polysilicon layer on the interpoly dielectric layer, wherein the tungsten silicide layer is formed on the second polysilicon layer.

18. A method of producing a flash memory device, comprising:

forming a first polysilicon layer having a thickness from about 800 Å to about 1,000 Å;

forming an insulating layer over the first polysilicon layer;

forming a second polysilicon layer over the insulating layer;

forming a tungsten silicide layer over the second polysilicon layer by chemical vapor deposition using $WF_6$ and $SiH_2Cl_2$;

forming a contact hole by etching through the tungsten silicide layer, the second polysilicon layer, and the insulating layer; and forming a contact in the contact hole, the contact touching the first polysilicon layer.

19. The method of claim 18, wherein the forming the first polysilicon layer includes depositing the first polysilicon layer using silane and a mixture of phosphine and a carrier gas by chemical vapor deposition at a temperature from about 450° C. to about 650° C. under a pressure from about 300 mTorr to about 500 mTorr.

20. The method of claim 19, wherein the mixture comprises from about 0.9% to about 1.1% of phosphine.

21. The method of claim 19, wherein the first polysilicon layer is formed by low pressure chemical vapor deposition using from about 1,500 sccm to about 2,500 sccm of silane and from about 10 sccm to about 30 sccm of the mixture of phosphine and the carrier gas.

22. The method of claim 19, wherein the first polysilicon layer is formed by low pressure chemical vapor deposition using from about 1,750 sccm to about 2,250 sccm of silane and from about 15 sccm to about 25 sccm of the mixture of phosphine and the carrier gas.

23. The method of claim 19, wherein the first polysilicon layer is deposited by chemical vapor deposition at a temperature from about 500° C. to about 600° C. under a pressure from about 350 mTorr to about 450 mTorr.

24. The method of claim 18, wherein the contact comprises tungsten.

25. The method of claim 18, wherein the first polysilicon layer has a thickness from about 850 Å to about 950 Å.

26. The method of claim 18, wherein the insulating layer is an ONO multilayer dielectric.

27. The method of claim 18, wherein the etching includes partially etching at least a portion the first polysilicon layer.

28. The method of claim 27, wherein the forming the contact includes forming the contact on the partially-etched portion of the first polysilicon layer.

* * * * *

UNITED STATES PATENT AND TRADEMARK OFFICE
CERTIFICATE OF CORRECTION

PATENT NO. : 6,355,522 B1
DATED : March 12, 2002
INVENTOR(S) : Chang et al.

It is certified that error appears in the above-identified patent and that said Letters Patent is hereby corrected as shown below:

Column 8,
Line 3, replace "oxymitride" with -- oxynitride --
Line 14, replace "maimer" with -- manner --

Column 10,
Line 8, replace "contacts" with -- contact. --

Column 11,
Line 27, repalce "polysiticon" with -- polysilicon --

Column 12,
Line 25, replace "$5X10_{19}$" with -- $5X10^{19}$ --

Signed and Sealed this

Tenth Day of December, 2002

JAMES E. ROGAN
*Director of the United States Patent and Trademark Office*